United States Patent
Kunze-Concewitz

(10) Patent No.: US 6,225,235 B1
(45) Date of Patent: May 1, 2001

(54) METHOD AND DEVICE FOR CLEANING AND ETCHING INDIVIDUAL WAFERS USING WET CHEMISTRY

(76) Inventor: Horst Kunze-Concewitz, Waldenserstrasse 41, D-75446 Wiernsheim (DE)

( * ) Notice: Subject to any disclaimer, the term of this patent is extended or adjusted under 35 U.S.C. 154(b) by 0 days.

(21) Appl. No.: 09/506,908

(22) Filed: Feb. 18, 2000

(51) Int. Cl.$^7$ .................................................. H01L 21/00
(52) U.S. Cl. ........................ 438/745; 156/345; 216/91; 216/92; 438/748
(58) Field of Search .................. 438/14, 8, 745, 438/747, 748, 753; 156/345 L, 345 LC, 345 LS; 216/84, 90, 92, 99

(56) References Cited

U.S. PATENT DOCUMENTS 4,557,785 * 12/1985 Ohkuma .............................. 216/91 X
5,879,576 * 3/1999 Wada et al. ......................... 216/92 X

* cited by examiner

Primary Examiner—William Powell

(57) ABSTRACT

The invention concerns a method for wet-chemical cleaning and etching of disc-shaped substrates in a closed processing chamber, wherein the substrate to be processed is received by a substrate support, the substrate is rotated and both sides of the substrate are simultaneously sprayed with chemicals.

22 Claims, 5 Drawing Sheets

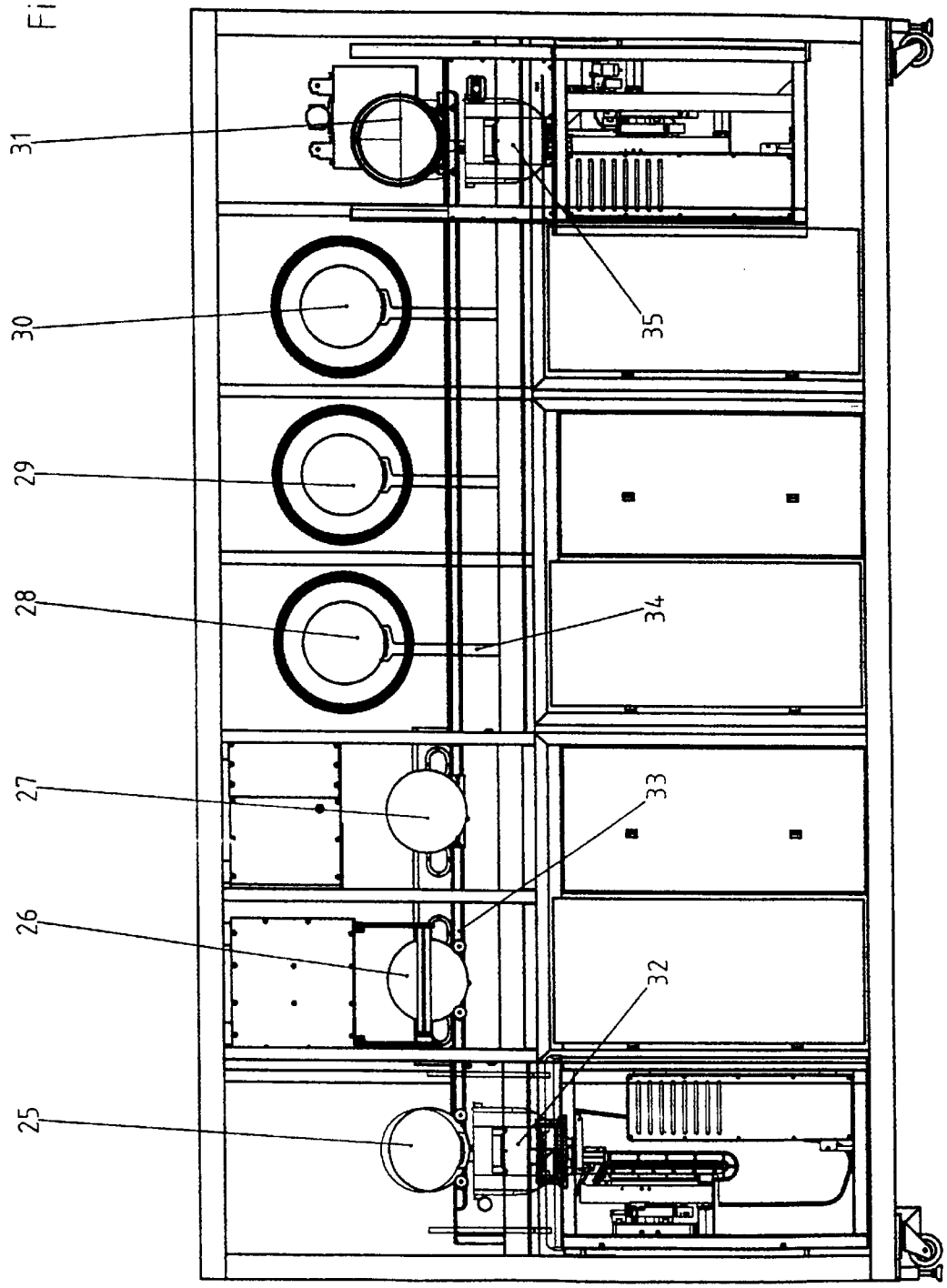

METHOD AND DEVICE FOR CLEANING AND ETCHING INDIVIDUAL WAFERS USING WET CHEMISTRY

BACKGROUND OF THE INVENTION

The invention concerns a method and a device for cleaning and etching disc-shaped substrates (wafers) using wet chemistry, for the production of micro-electronic components.

In addition to physical cleaning methods (e.g. brush cleaning, megasonic vapor cleaning), cleaning of wafers, i.e. elimination of contaminants (e.g. organic particle metal-ion contaminants) and natural oxides from the wafer surface, is carried out with high concentration chemicals such as $H_2SO_4$, $H_2O_2$, HF, NF, $NH_4OH$, DI—$H_2O$ (de-ionized water) etc. or with a mixture of chemicals for e.g. RCA, SC1, SC2 methods. Dipping installations are preferably used for chemical treatment using highly aggressive chemicals, wherein the wafers are dipped into processing basins filled with chemicals.

Dipping installations have the advantage that the wafer is chemically treated on both sides in a bath and the throughput is relatively high due to dipping of several commonly borne substrates in one step.

Disadvantageously, such installations consume-large amounts of chemicals and therefore require a large chemical supply and a large amount of space in the clean room, and are also expensive. Moreover, the treatment of several substrates in one step is only possible due to the long processing times associated with the dipping method.

The larger the component integration on a wafer and the larger the wafer diameters, the greater is the need for reproducible processing of each individual wafer in exactly the same manner. This cannot be reliably achieved in dipping installations.

Spraying and etching systems of conventional construction, e.g. continuous spraying systems, cannot be used, since very aggressive chemicals are required and since the substrate must be treated uniformly on both sides. Moreover, there are extremely strict processing parameter requirements with respect to uniformity of the chemical action, freedom from particles, from metal-ion contamination etc., such that the processing chamber must be constructed in a very specific manner.

Spin processors are sometimes used with which an individual wafer is rotated on a support (chuck) and simultaneously sprayed with chemicals. Disadvantageously thereby is that simultaneous, uniform treatment of the front and rear sides is not possible due to the substrate support. The substrate must be turned in the support and the front and rear sides must be treated, one after the other. If several sequential processes are carried out, the processing time per wafer of spin processors is unacceptably long, resulting in low throughput. Moreover, the required material chemical resistance precludes combination in an installation together with physical cleaning methods.

When several spin processors are used, the plant is unacceptably expensive, excessively large. In addition, handling between the processors is unacceptably demanding and expensive.

It is therefore the underlying purpose of the invention to provide a method and a device for wet chemical cleaning and etching of disc-shaped substrates (wafers) which permits simultaneous processing of several wafers, wherein individual substrates can be processed simultaneously, on both sides, using chemical methods.

SUMMARY OF THE INVENTION

This object is solved in accordance with the invention with a method and a device as claimed.

The object is solved in accordance with the inventive device and method, wherein the wafer to be treated is held vertically in a support at the edge area (3 points). The support can be rotated by a drive. This rotating support is disposed in a processing chamber comprising two parts, which is opened for loading the wafer. The treatment chemicals are sprayed onto the substrate from both sides with the processing chamber closed. The substrate is rotated during spraying. This effects uniform distribution of the medium on the surface as well as centrifugation of the chemicals, already active on the surface and therefore depleted. Chemical treatment is followed by rinsing of the substrate with water. The substrate can also be spin-dried for further transport. After rinsing, the processing chamber is opened, the substrate is removed from the substrate support via a gripping device and e.g. passed, via a transport means or a handling robot, to the next processing chamber of identical construction for further chemical treatment, or loaded into a centrifuge for drying. By providing several processing chambers, the substrates which are each transported from chamber to chamber can be processed simultaneously in the respective chamber to effect a correspondingly high throughput.

A substantial advantage of the invention is the high etching rate homogeneity due to the uniform chemical action, the small amount of particles generated and the low metal-ion contamination. Moreover, the throughput is high, a combination of physical and chemical cleaning methods, within an installation, is easy to realize and the required space for the installation in the clean room is low for the ever increasing substrate sizes (e.g. 300 mm, 400 mmm etc.).

The processing chamber is constructed symmetrically with respect to rotation to minimize turbulences of the rotating substrate. In addition to the rotationally symmetric construction of the substrate support and the processing chamber, the shape and surface characteristics of all parts in the chamber is selected to facilitate simple but highly thorough rinsing and therefore automatic cleaning of the processing chambers which also minimizes particle contamination in the processing chamber.

The very simple construction of the processing chamber and the substrate support permits manufacture from plastic materials resistant to the aggressive chemicals used to thereby also satisfy the high requirements for low metal contamination.

The closed processing chamber allows use of aggressive chemicals without having to take costly precautions for the entire installation with respect to material resistance and safety. Vertical processing of the wafer facilitates construction of an installation which is small in size. The sprayed and centrifuged chemicals are collected in the processing chamber via an outlet and are regenerated. This ensures minimum use of chemicals and a steady etching rate homogeneity from substrate to substrate, since each substrate is processed under the same conditions (constant chemical concentration).

To optimize processing of each individual wafer, end point detectors can also be used to allow optimum processing control for each wafer without having to e.g. precisely keep the media parameters (temperature, concentration, sprayed amount etc.) constant from wafer to wafer, since processing is controlled by the detector.

To avoid cross contamination throughout the installation, a reciprocating wafer transport system is used which transports each wafer from only one processing station to the next and, after transport, returns to the initial position. This prevents transport of particles, as can occur e.g. with a continuous conveyer belt.

The nozzles for spraying the chemicals are cleaned by subsequent spraying of rinsing media (in most cases water) between the processing steps. This is achieved by connecting the spraying nozzle to a valve battery to allow different chemicals to be sprayed, one after another, and also to allow the spray nozzle to be rinsed with water.

The chemicals can be supplied using a combined valve battery and mixing device to define a mixing ratio of the etching solution composition, optionally, directly before spraying. This is particularly important when chemical mixtures are used which tend to decompose and can therefore not be stored in the form of a mixture for long periods of time.

Spraying of different processing chemicals from various nozzles is also possible, with the chemicals first being mixed together on the substrate surface.

In accordance with the invention, some or all cleaning, etching and spraying processes can be carried out sequentially in a processing chamber, e.g. in laboratories. Rinsing and, optionally, cleaning of the chamber can be carried out between the individual processes. Chemical treatment can be easily incorporated into installations having physical cleaning such that the methods can be carried out one after the other in sequential processing chambers (FIG. 5). Substrate handling from the magazines and within the plant is performed with the wafer directed or positioned vertically.

BRIEF DESCRIPTION OF THE DRAWING

Further advantages, features and details can be extracted from the dependent claims and the subsequent description of a particularly preferred embodiment with reference to the drawing. The features shown in the drawing and recited in the claims and description may be essential to the invention either individually or in any arbitrary combination.

FIG. 5 shows the construction of an automated installation for wet chemical treatment of substrates.

DESCRIPTION OF THE PREFERRED EMBODIMENT

Figure 1:
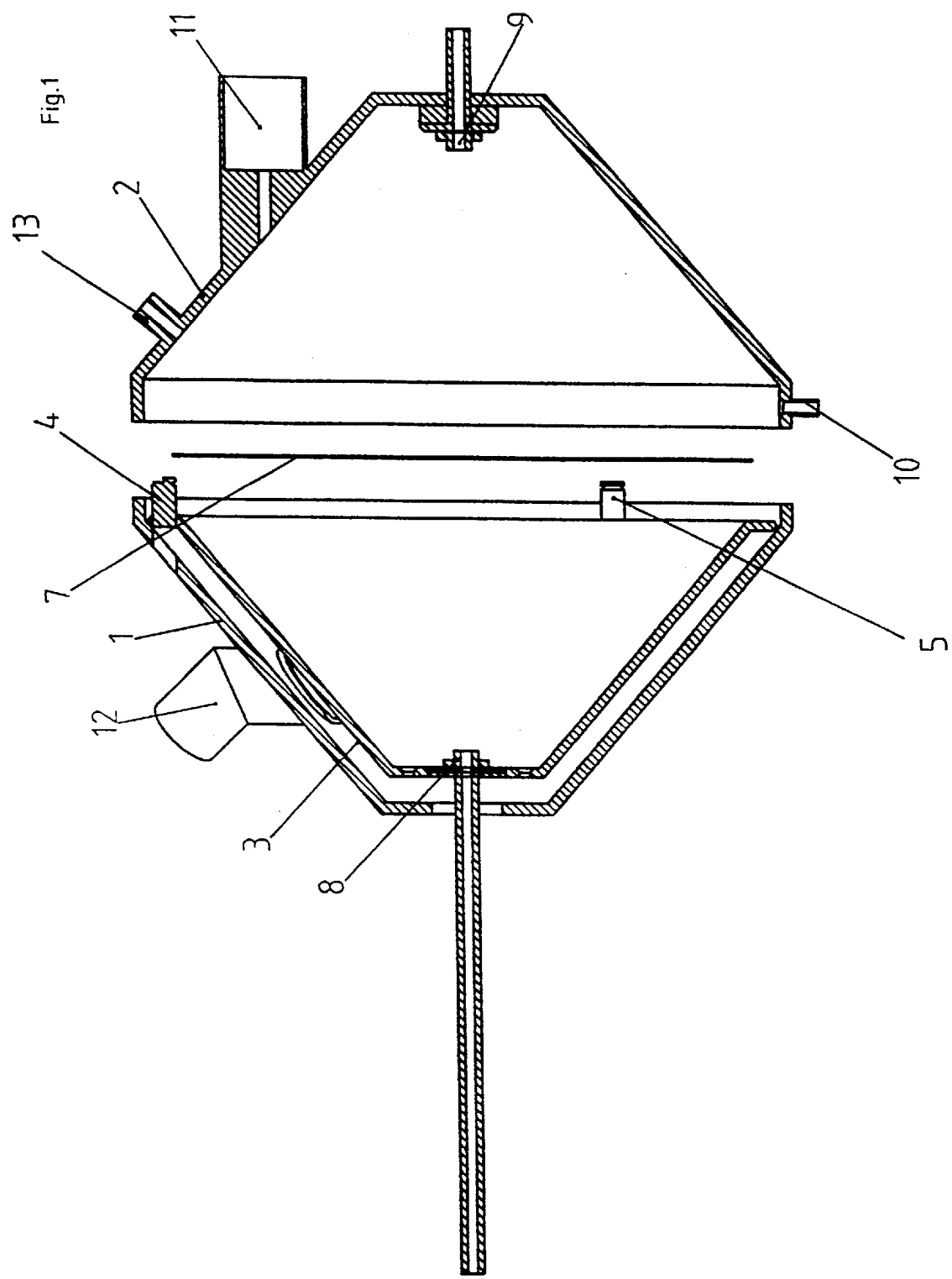
FIG. 1 schematically shows an open processing chamber.

FIG. 1 shows the basic construction of the (open) processing chamber. It consists of two processing chamber halves 1 and 2 which can be moved with respect to one another for opening or closing.

Figure 3:
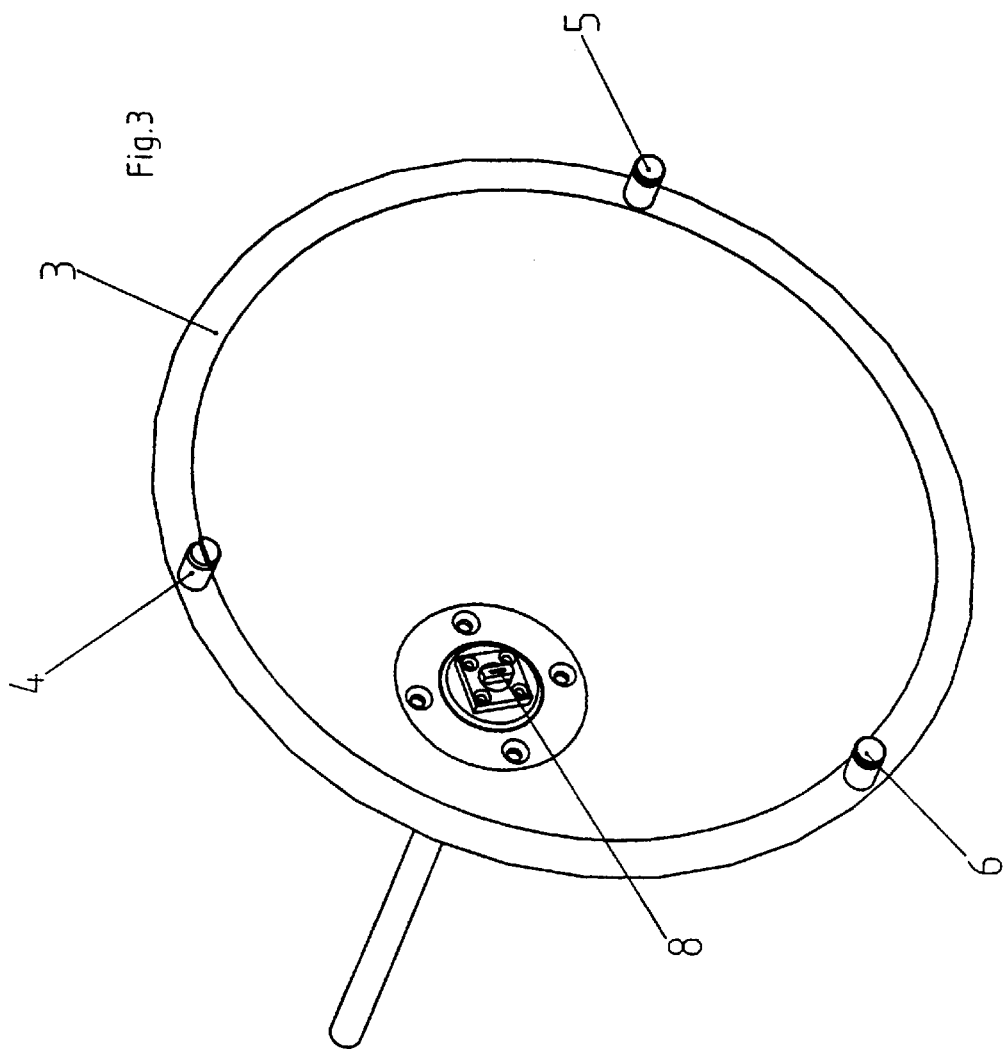
FIG. 3 shows a substrate support.

A funnel-shaped substrate support (chuck) 3 is disposed in the processing chamber for receiving a substrate 7 via receiving pins 4, 5 and 6 (see also FIG. 3). The center of the substrate support (chuck) 3, which can be rotated by a drive, is provided with a stationary spraying nozzle 8 which sprays onto one side of the substrate 7. The other side of the substrate 7 is sprayed via a nozzle 9 associated with the other processing chamber half 2 and disposed in its center. The sprayed and centrifuged liquid can drain from the processing chamber via an outlet 10.

Figure 2:
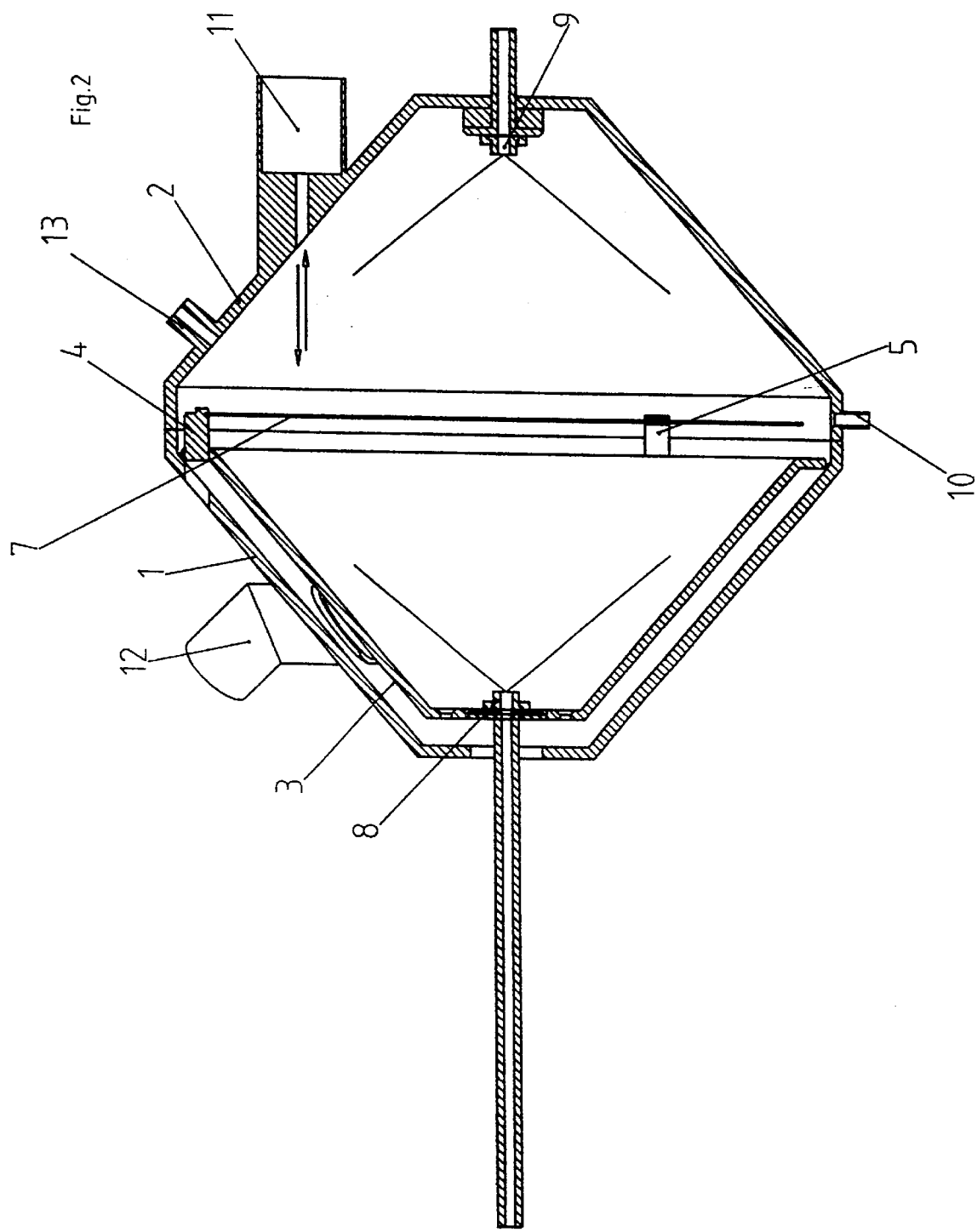
FIG. 2 shows the closed processing chamber.

FIG. 2 shows the closed processing chamber in which an "end point" detector 11 can be installed for processing control, and with a suction pipe 12 for suctioning vapors from the processing chamber, if required. The processing chamber can be fed with gases via a gas inlet pipe 13.

FIG. 3 shows the substrate support (chuck) 3. The substrate (not shown) is held by bolts 4, 5, 6. The upper bolt 6 can rotate and, due to the bolt 6 shape, the substrate supported on the bolts 4 and 5 is held after rotation of the bolt 6. For this purpose, the bolt 6 is provided with a radial and axial step.

Figure 4:
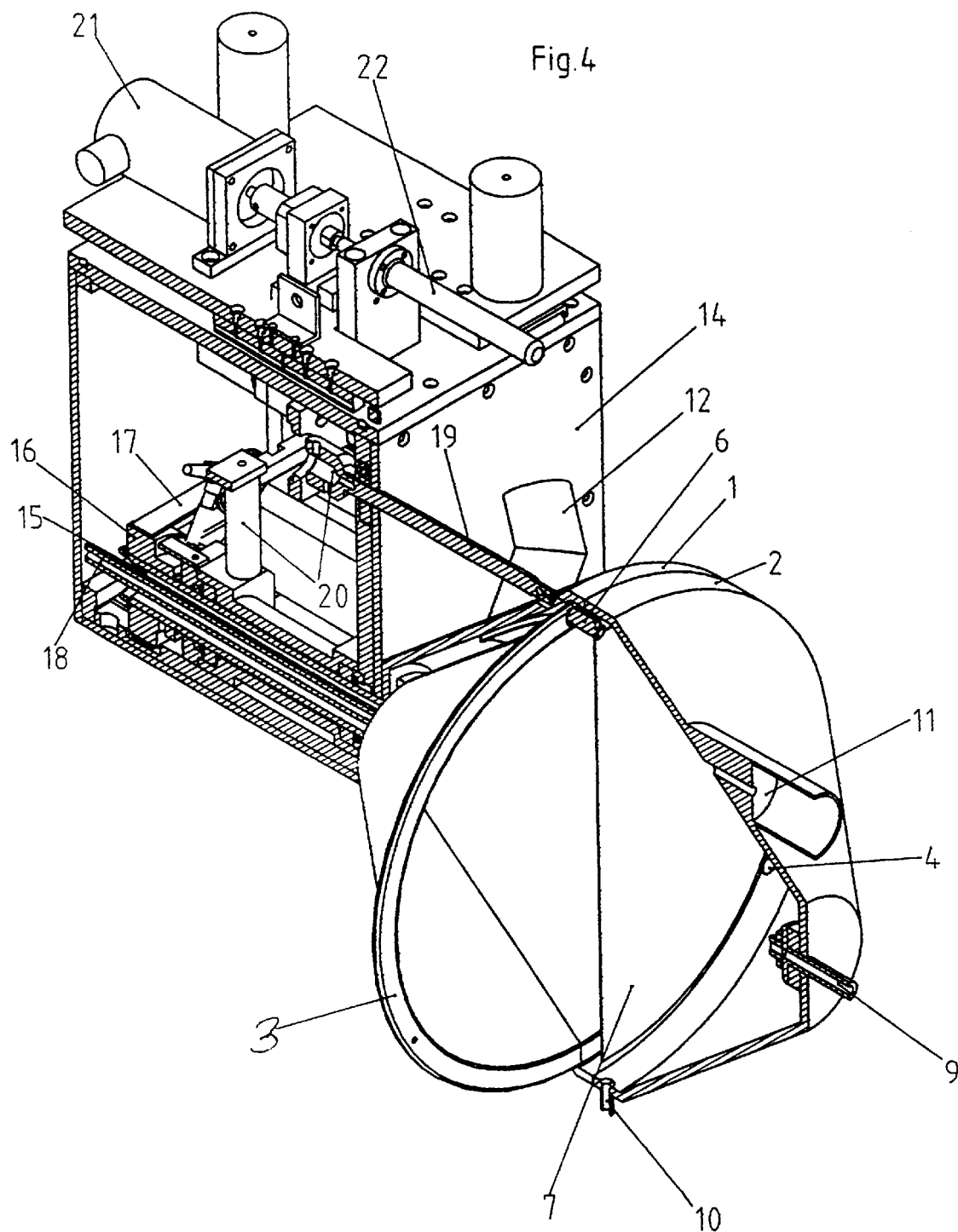
FIG. 4 shows a sectional drawing of the processing chamber with the associated drives.

FIG. 4 shows a sectional view of the processing chamber with the associated drives mounted to a drive unit 14. A drive serves for rotating the substrate 7 within the processing chamber. The substrate 7 is held between the bolts 4, 5 and 6 of the substrate support 3. The substrate support 3 is mounted on a hollow shaft 15 which is driven by a motor via a toothed disc 16 and a toothed belt 17.

The hollow shaft 15 contains the media inlet 18 to the spray nozzle 8 (see FIG. 3).

A closing bolt 19 rotates the bolt 6 of the substrate support and locks or releases the substrate 7. To enable rotation of the substrate support 3 and the substrate 7 after locking of the substrate 7, the closure has to be removed from the substrate support 3 after twisting of the bolt 6. For this purpose, the closing bolt 19 is connected to a drive which can rotate the closure 19 and also displace the bolt in its longitudinal direction.

For opening the processing chamber, the entire drive unit 14, to which one half of the processing chamber is rigidly mounted, is displaced by a drive 21 via a threaded spindle 22. The front half of the processing chamber can be stationary. Substrates 7 can be loaded and unloaded into the opened processing chamber via a handling system. After loading, the substrate 7 is locked on the substrate support 3 by the closure bolt 19. The processing chamber halves 1 and 2 are then closed with the threaded spindle 22 via the drive 21. The substrate 7 in the chamber is rotated via the drive unit 14 and sprayed with chemicals from both sides via the nozzles 8 and 9.

FIG. 5 shows the construction of an automated installation for wet-chemical treatment of substrates 7 into which the above-described processing module for the chemical processes is installed as an installation component, e.g. processing modules 26 to 30.

The substrates 7 from a substrate supply 25 in a magazine 32 are placed onto a transport device 33 and transported to the processing module 26, where they are lifted to a cleaning station and cleaned. After lifting the substrates 7 from the transport device 33, the latter can move back and receive the next substrate 7. The reciprocating movement of the transport device 33 prevents cross-contamination (transport of contamination) within the installation.

Processing modules 26 and 27 can be used e.g. for physical cleaning methods, such as vapor cleaning, brush cleaning, megasonic, etc. The processing modules 28, 29 and 30 can be used for the chemical processes SC1, SC2, RCA, etc., in closed processing chambers.

Loading and unloading of the processing chambers is effected e.g. via a handling gripping device 34.

The substrate 7 is dried in the processing module 31. The dried substrates 7 are disposed in the magazine 35.

What is claimed is:

1. A method for wet-chemical cleaning and etching of disc-shaped substrates, the method comprising the steps of:

a) opening a processing chamber, said processing chamber having a substrate support;

b) disposing a substrate on said substrate support;

c) closing said processing chamber;

d) rotating the substrate; and e) simultaneously spraying both sides of the substrate with chemicals.

2. A device for wet-chemical cleaning and etching of disc-shaped substrates, the device comprising:

a processing chamber having at least two processing chamber halves which are displaced with respect to each other to open and close said processing chamber;

a substrate support mounted within said processing chamber;

means for rotating a substrate when the substrate is disposed on said substrate support; and means for simultaneously spraying both sides of the substrate with chemicals.

3. The device of claim 2, further comprising a handling gripping device for loading and removing the substrate from said substrate support when said processing chamber is open.

4. The device of claim 3, wherein said substrate support comprises a first stationary bolt, a second stationary bolt, and a third moveable bolt, wherein said handling gripping device disposes the substrate on said first and said second bolts and said third bolt moves to fix the substrate in said substrate support.

5. The device of claim 2, wherein said substrate support has a funnel-shape, a center of said funnel-shape having at least one fixed spray nozzle for spraying chemicals onto a rotating substrate.

6. The device of claim 2, wherein at least one processing chamber half has at least one outlet to drain sprayed medium, centrifuged from the substrate, out of said processing chamber.

7. The device of claim 2, wherein said processing chamber comprises at least one suction pipe to suction off produced vapors and gases.

8. The device of claim 2, wherein said processing chamber comprises a gas inlet pipe for treating said processing chamber with a protective gas to control chemical processes when spraying chemicals onto the substrate.

9. The device of claim 8, wherein said protective gas is at least one of $N_2$ and $O_2$.

10. The device of claim 2, wherein said spraying means comprise a plurality of spray nozzles having at least one of differing opening angles and differing jet shapes for single substance and multiple substance spraying.

11. The device of claim 10, wherein said plurality of spray nozzles are at least one of flat jet and full jet in shape.

12. The device of claim 10, further comprising means for adjusting and displacing said spray nozzles to separations from the substrate for spraying one of substrate portions and an entire substrate.

13. The device of claim 10, further comprising automatic means cooperating with said spray nozzles for cleaning said processing chamber.

14. The device of claim 10, wherein said spray nozzles are at least one of mixing and multiple substance nozzles to effect mixing of said chemicals only in said spray nozzles.

15. The device of claim 10, wherein each chemical is sprayed with a respective nozzle and mixing takes place only when said chemicals impinge on the substrate.

16. The device of claim 2, wherein a speed of substrate rotation and a spraying of said chemicals are coordinated to minimize chemical consumption.

17. The device of claim 2, further comprising a process detector to optimize process control for each substrate.

18. The device of claim 17, wherein said process detector is a reflection-based end point detector.

19. The device of claim 2, further comprising an additional processing chamber cooperating with said processing chamber for one of various processes and several identical processes.

20. The device of claim 19, further comprising a plurality of processing chambers connected one after the other to form processing modules.

21. The device of claim 20, further comprising a linear transport means for transporting the substrate to and between said processing modules.

22. The device of claim 21, wherein said transport means reciprocates with only one respective processing module width.

* * * * *